(12) United States Patent
Ko et al.

(10) Patent No.: US 11,810,890 B2
(45) Date of Patent: Nov. 7, 2023

(54) FLIP-CHIP BONDING APPARATUS USING VCSEL DEVICE

(71) Applicant: PROTEC CO., LTD., Gyeonggi-do (KR)

(72) Inventors: Youn Sung Ko, Chungcheongnam-do (KR); Geunsik Ahn, Seoul (KR)

(73) Assignee: PROTEC CO., LTD., Gyeonggi-do (KR)

( * ) Notice: Subject to any disclaimer, the term of this patent is extended or adjusted under 35 U.S.C. 154(b) by 320 days.

(21) Appl. No.: 17/237,078

(22) Filed: Apr. 22, 2021

(65) Prior Publication Data

US 2021/0335748 A1   Oct. 28, 2021

(30) Foreign Application Priority Data

Apr. 23, 2020   (KR) .................. 10-2020-0049451

(51) Int. Cl.
*B23K 3/00* (2006.01)
*H01L 23/00* (2006.01)

(52) U.S. Cl.
CPC ........ *H01L 24/75* (2013.01); *H01L 2224/759* (2013.01); *H01L 2224/75263* (2013.01); *H01L 2224/75981* (2013.01); *H01L 2924/3511* (2013.01)

(58) Field of Classification Search
CPC ............ B23K 2103/56; B23K 26/0604; B23K 1/0016; B23K 2101/36; B23K 2101/40; B23K 2101/42; B23K 26/0648; B23K 3/087; B23K 37/047; B23K 26/032; B23K 26/0676; B23K 26/0665
See application file for complete search history.

(56) References Cited

U.S. PATENT DOCUMENTS

| | | | |
|---|---|---|---|
| 6,394,158 B1 | 5/2002 | Momeni | |
| 7,098,076 B2 | 8/2006 | Liu | |
| 7,464,850 B2 | 12/2008 | Kim | |
| 8,967,452 B2 | 3/2015 | Cheung et al. | |
| 9,162,320 B2 | 10/2015 | Tanaka et al. | |
| 9,627,348 B2 | 4/2017 | Ryu et al. | |
| 9,632,265 B2 | 4/2017 | Nekado et al. | |
| 9,817,192 B2 | 11/2017 | Nekado et al. | |
| 10,103,040 B1 | 10/2018 | Oosterlaken et al. | |
| 10,497,665 B2 | 12/2019 | Ahn | |
| 2016/0049381 A1 | 2/2016 | Ryu et al. | |
| 2018/0286711 A1* | 10/2018 | Oosterlaken | B23K 37/047 |
| 2018/0366435 A1* | 12/2018 | Ahn | B23K 1/0056 |
| 2020/0111939 A1* | 4/2020 | Brodoceanu | H01L 24/81 |

(Continued)

FOREIGN PATENT DOCUMENTS

| | | |
|---|---|---|
| CN | 103801840 | 3/2017 |
| JP | 2001148403 | 5/2001 |

(Continued)

*Primary Examiner* — Erin B Saad
(74) *Attorney, Agent, or Firm* — JCIPRNET

(57) ABSTRACT

Provided is a flip-chip bonding apparatus using VCSEL device, and more particularly, to a flip-chip bonding apparatus using VCSEL device for bonding a flip-chip type semiconductor chip to a substrate using infrared laser light generated from the VCSEL device. The flip-chip bonding apparatus using VCSEL device may quickly control laser light to bond a semiconductor chip to a substrate, with high productivity and high quality.

18 Claims, 3 Drawing Sheets

(56) References Cited

U.S. PATENT DOCUMENTS

| | | |
|---|---|---|
| 2020/0215645 A1 | 7/2020 | Ahn |
| 2022/0161355 A1* | 5/2022 | Hunze .................. B29C 64/153 |
| 2022/0266385 A1* | 8/2022 | Brodoceanu ......... B23K 26/082 |
| 2023/0055776 A1* | 2/2023 | Thompson ......... B23K 26/0648 |

FOREIGN PATENT DOCUMENTS

| | | |
|---|---|---|
| JP | 2017125483 | 7/2017 |
| KR | 100662820 | 12/2006 |
| KR | 20080101329 | 11/2008 |
| KR | 20190100777 | 8/2019 |
| TW | 201736887 | 10/2017 |
| TW | 201906106 | 2/2019 |

\* cited by examiner

FLIP-CHIP BONDING APPARATUS USING VCSEL DEVICE

CROSS-REFERENCE TO RELATED APPLICATION

This application claims the benefit of Korean Patent Application No. 10-2020-0049451, filed on Ap. 23, 2020, in the Korean Intellectual Property Office, the disclosure of which is incorporated herein in its entirety by reference.

BACKGROUND

Technical Field

The present disclosure relates to a flip-chip bonding apparatus using a vertical cavity surface emitting laser (VCSEL) device, and more particularly, to a flip-chip bonding apparatus using VCSEL device for bonding a flip-chip type semiconductor chip to a substrate using infrared laser light generated from the VCSEL device.

Description of the Related Art

As electronic products become smaller, flip-chip type semiconductor chips that do not use wire bonding are widely used. The flip-chip type semiconductor chip is mounted on the substrate in such a manner that a plurality of electrodes in the form of solder bumps are formed on a lower surface of the semiconductor chip and bonded to positions corresponding to the solder bumps formed on the substrate.

As such, a method of mounting a semiconductor chip on a substrate using a flip-chip method includes a reflow method and a laser bonding method. The reflow method is a method of bonding the semiconductor chip to the substrate by performing high-temperature reflow while placing a semiconductor chip coated with a flux on a solder bump on a substrate. Like the reflow method, the laser bonding method is a method of bonding the semiconductor chip to the substrate by instantaneously melting and hardening the solder bump by irradiating a laser beam to the semiconductor chip to transmit energy while placing the semiconductor chip coated with the flux on the solder bump on the substrate.

Recently used flip-chip type semiconductor chips tend to be thinner to tens of micrometers or less. When the semiconductor chip is thin as described above, the semiconductor chip is often bent or warped finely due to internal stress of the semiconductor chip itself. When the semiconductor chip is deformed as described above, some of the solder bumps of the semiconductor chip may be bonded without contacting the corresponding solder bump of the substrate. This situation leads to a defect in the semiconductor chip bonding process. In addition, when the temperature of the semiconductor chip and the substrate is increased in order to bond the semiconductor chip to the substrate, the semiconductor chip or the substrate may be partially bent or warped due to a difference in the thermal expansion coefficient of the material. This phenomenon also causes a defect in the semiconductor chip bonding process.

In the reflow method, there is a problem in that the semiconductor chip is bent by exposing the semiconductor chip to a high temperature for a long time, and it takes time to cool the semiconductor chip, thereby reducing productivity.

The laser bonding method uses a laser light source generator and a homogenizer. In the method of using such a laser light source, since the energy level of the laser generated by the homogenizer is too high, it is used by lowering the energy level by using a complex optical system. In addition, the complex optical system is required to irradiate laser light with uniform energy over the irradiation area. Such a conventional laser light irradiation method requires the complex optical system, so that the overall structure of the apparatus is complicated and it is inconvenient to use.

SUMMARY

The present disclosure is to solve the above-described problems, and an object of the present disclosure is to provide a flip-chip bonding apparatus using a vertical cavity surface emitting laser (VCSEL) device capable of quickly and efficiently bonding a flip-chip type semiconductor chip to a substrate using a laser light without using a complex optical system.

Additional aspects will be set forth in part in the description which follows and, in part, will be apparent from the description, or may be learned by practice of the presented embodiments.

A flip-chip bonding apparatus using VCSEL device according to the present disclosure for achieving the above object includes a substrate mounting unit on which a substrate on which a plurality of semiconductor chips are disposed is mounted, wherein the plurality of semiconductor chips are disposed to be bonded to an upper surface of the substrate; a laser head having a plurality of VCSEL arrays and a head body on which the plurality of VCSEL arrays are installed, wherein the plurality of VCSEL arrays include a plurality of VCSEL devices emitting infrared laser so as to bond the semiconductor chip to the substrate by irradiating infrared laser light to the semiconductor chip on the substrate mounted on the substrate mounting unit; a head transfer unit transferring the laser head; and a control unit controlling an operation of the laser head and the head transfer unit.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
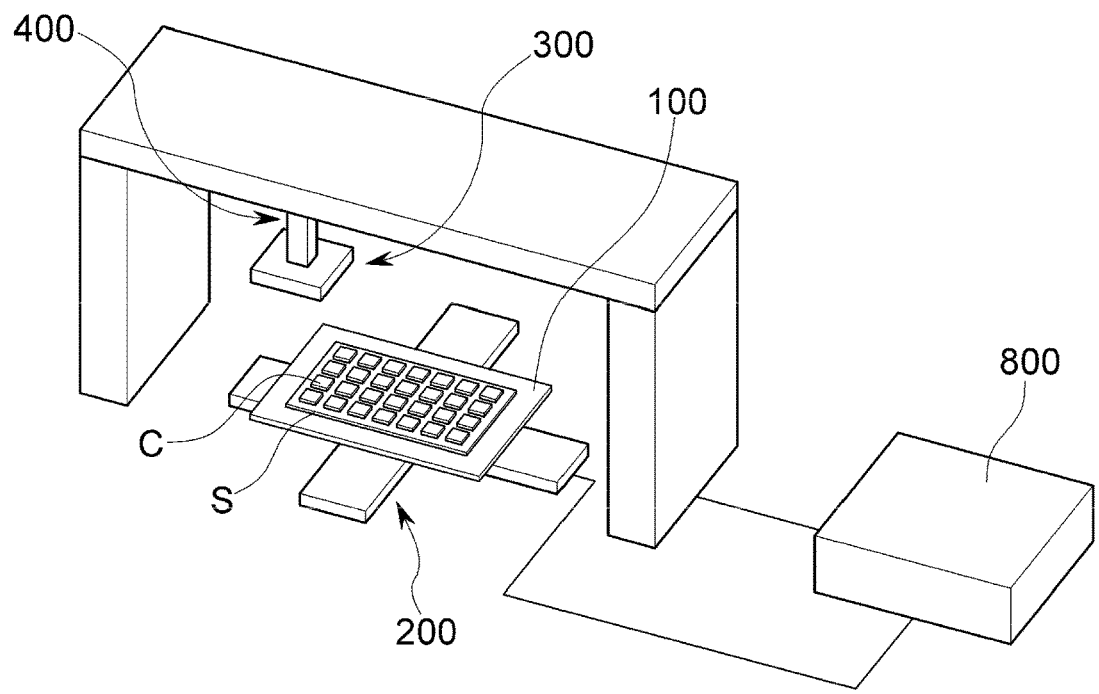
FIG. 1 is a schematic perspective view of a flip-chip bonding apparatus using a vertical cavity surface emitting laser (VCSEL) device according to an embodiment of the present disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects.

Hereinafter, a flip-chip bonding apparatus using VCSEL device according to the present disclosure will be described in detail with reference to the accompanying drawings.

Figure 2:
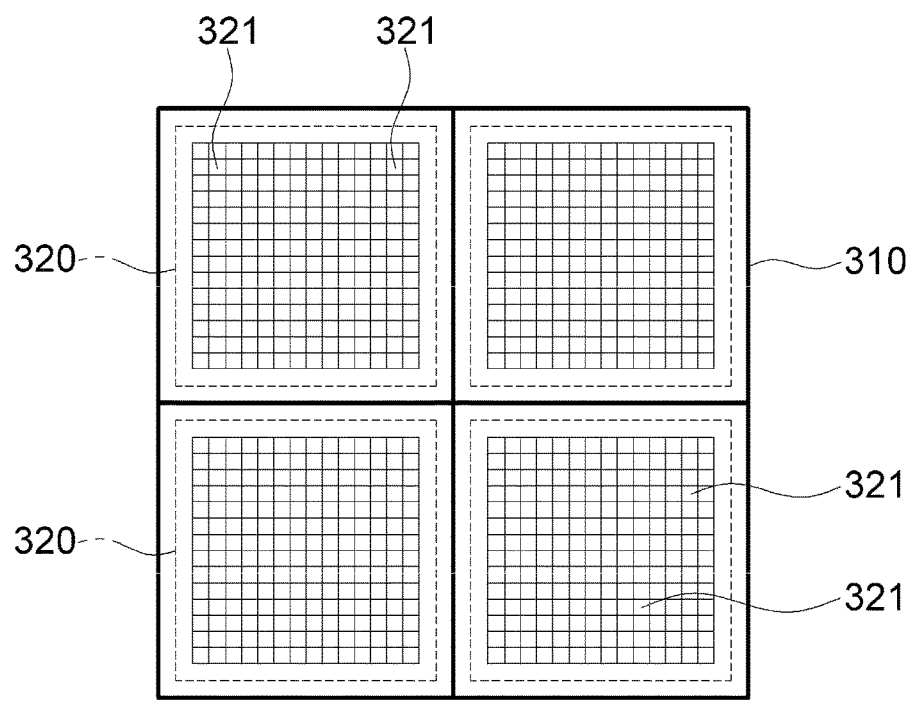
FIG. 2 is a bottom view of a part of the flip-chip bonding apparatus using VCSEL device shown in FIG. 1.
Figure 3:
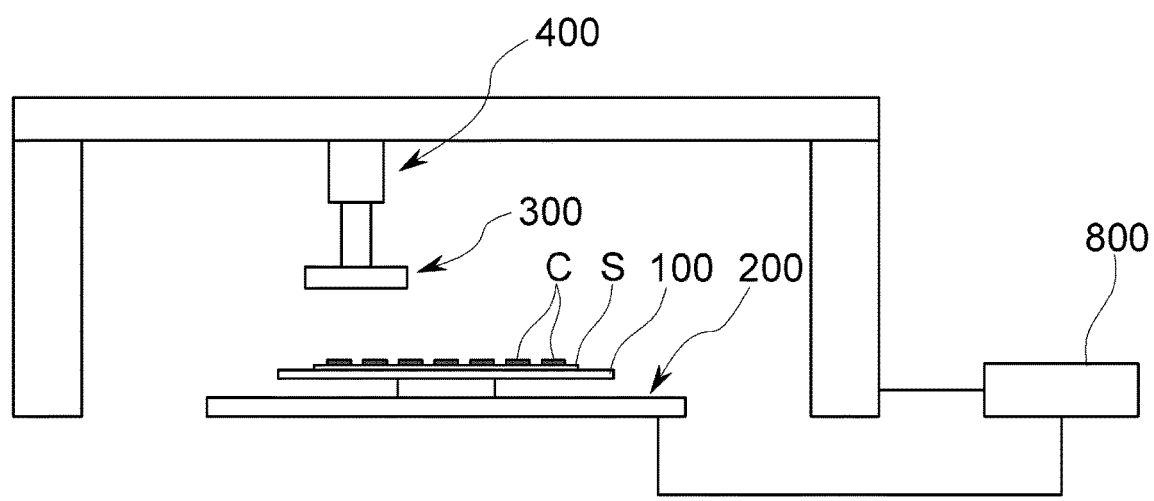
FIG. 3 is a front view of the flip-chip bonding apparatus using VCSEL device shown in FIG. 1.

FIG. 1 is a schematic perspective view of a flip-chip bonding apparatus using VCSEL device according to an embodiment of the present disclosure, FIG. 2 is a bottom view of a part of the flip-chip bonding apparatus using a vertical cavity surface emitting laser (VCSEL) device shown in FIG. 1, FIG. 3 is a front view of the flip-chip bonding apparatus using VCSEL device shown in FIG. 1.

The flip-chip bonding apparatus using VCSEL device of this embodiment is an apparatus for bonding a semiconductor chip C to a substrate S by using infrared laser light generated from the VCSEL device 321. Since solder bumps are formed on either or both of the substrate S and the semiconductor chip C, the solder bumps are instantaneously melted and hardened by the energy transmitted by the infrared laser light, so that the semiconductor chip C is bonded to the substrate S.

Referring to FIGS. 1 to 3, the flip-chip bonding apparatus using VCSEL device of this embodiment includes a substrate mounting unit 100, a laser head 300, a head transfer unit 400, a substrate transfer unit 200, and a control unit 800.

The substrate S is disposed on the substrate mounting unit 100. In this embodiment, the substrate mounting unit 100 adsorbs and fixes the lower surface of the substrate S. Various structures for fixing the substrate S while supporting the lower surface of the substrate S may be used as the substrate mounting unit 100.

The substrate S on which a plurality of semiconductor chips C are disposed, is mounted on the substrate mounting unit 100. The substrate mounting unit 100 is transferred back and forth, left and right by the substrate transfer unit 200. The substrate transfer unit 200 adjusts the position of the substrate mounting unit 100 by transferring the substrate mounting unit 100 in a horizontal direction.

The laser head 300 is disposed above the substrate mounting unit 100. The laser head 300 includes a plurality of VCSEL arrays 320 and a head body 310. The head body 310 is formed in the form of a bracket or a frame, and the VCSEL array 320 is installed to be attachable and detachable to the head body 310. The VCSEL array 320 includes a plurality of VCSEL devices 321. All of the VCSEL devices 321 used in this embodiment are composed of the VCSEL device 321 in the form of a vertical cavity surface emitting laser. As the VCSEL device 321 in the form of the VCSEL is used as described above, it is possible to generate an infrared laser light having excellent straightness, high energy level, and easy control. The VCSEL array 320 is configured such that a plurality of the VCSEL devices 321 are arranged in rows and columns at regular intervals. The head body 310 is configured such that the VCSEL arrays 320 of this type are again aligned with rows and columns to be arranged at regular intervals. The number, spacing, and types of the VCSEL devices 321 and the VCSEL arrays 320 may be variously configured according to a purpose. All of the VCSEL devices 321 constituting the VCSEL array 320 may be configured identically, and it is also possible to configure the VCSEL array 320 so that different types of VCSEL devices 321 may be arranged according to positions in accordance with the structure of the semiconductor chip C to be bonded. It is also possible to configure different types of the VCSEL device 321 constituting the VCSEL array 320 in units of the VCSEL array 320. It is also possible to configure the VCSEL array 320 in various forms, such as configuring the VCSEL array 320 as a VCSEL device 321 of one or two columns or a VCSEL device 321 of one or two rows.

In this embodiment, each of the VCSEL arrays 320 is formed to correspond to the size and shape of the semiconductor chip C to be bonded.

In addition, the VCSEL array 320 of the present embodiment is installed to be attachable and detachable to the head body 310, respectively. Each of the VCSEL devices 321 configures the VCSEL array 320 in an attachable and detachable form and installed on the head body 310 so that the combination of the VCSEL devices 321 constituting the VCSEL array 320 may be changed as necessary. In this case, it is also possible to configure the head body 310 by combining the VCSEL device 321 or the VCSEL array 320 each having different outputs or emitting infrared laser light of different frequencies.

The laser head 300 is transferred by the head transfer unit 400. In this embodiment, the head transfer unit 400 is configured to lift the laser head 300. According to an embodiment, it is also possible to use the head transfer unit 400 having a structure that moves and rotates the head transfer unit in a horizontal direction and an up-down direction.

The control unit 800 controls the operation of the laser head 300, the head transfer unit 400, and the substrate transfer unit 200. The control unit 800 operates the head transfer unit 400 to adjust the height of the laser head 300, and operates the substrate transfer unit 200 to adjust the position of the substrate S. In addition, the control unit 800 controls the operation of the laser head 300 to blink the VCSEL devices 321 of the laser head 300 and adjust the output of each of the VCSEL devices 321. In addition, the control unit 800 adjusts the blinking of each of the VCSEL devices 321 and the intensity of the output infrared laser light according to the pre-input profile over time. The control unit 800 may control the operation of the VCSEL device 321 in units of the VCSEL array 320. That is, the control unit 800 may control the operation of each of the VCSEL arrays 320 so that the VCSEL devices 321 belonging to the same VCSEL array 320 blink at the same time and are synchronized with each other to adjust the output. In this way, the VCSEL device 321 belonging to the same VCSEL array 320 may be connected in series with each other so that the control unit 800 may effectively control the VCSEL array 320 and the VCSEL array 320 may be compactly configured.

The flip-chip bonding apparatus using VCSEL device of this embodiment generates the infrared laser in an area corresponding to the size of the semiconductor chip C by using the laser head 300 configured as described above and directly irradiates the semiconductor chip C. Accordingly, the flip-chip bonding apparatus using VCSEL device according to the present embodiment has an advantage of not requiring a separate optical system for condensing, spectroscopy, or changing a path of the infrared laser between the laser head 300 and the semiconductor chip C.

Hereinafter, the operation of the flip-chip bonding apparatus using VCSEL device configured as described above will be described.

First, the substrate S is disposed on the substrate mounting unit 100 while the plurality of semiconductor chips C are disposed on the substrate S. In this state, the substrate transfer unit 200 moves the substrate mounting unit 100 in a horizontal direction to transfer the substrate S to a position for bonding each of the semiconductor chips C on the substrate S. Since each of the semiconductor chips C is disposed on the substrate S while the flux is applied to the substrate S, the semiconductor chips C are temporarily adhered to the substrate S due to the positive viscosity or adhesiveness. Unless a relatively large vibration or external force is applied, the semiconductor chips C disposed on the substrate S are not shaken by the flux and their positions relative to the substrate S are maintained. At this time, the semiconductor chip C disposed on the substrate S is photographed using an optical device such as a camera, and the position of each semiconductor chip C is determined, and the control unit 800 may adjust the position of the substrate S by using this information.

In this state, the control unit 800 lowers the laser head 300 by operating the head transfer unit 400. The control unit 800 may lower the laser head 300 until the laser head 300 contacts the semiconductor chip C, and may lower the laser head 300 to a position not in contact with the semiconductor chip C but very close to the upper surface of the semiconductor chip C.

In this state, the control unit 800 turns on each of the VCSEL devices 321 of the laser head 300 to irradiate the infrared laser light onto the semiconductor chip C. In this embodiment, the laser head 300 is configured such that the area of each of the VCSEL arrays 320 is the same as the area of the semiconductor chip C to be bonded, and such that the spacing between each of the VCSEL arrays 320 is the same as the spacing between the semiconductor chips C disposed on the substrate S. In addition, as shown in FIG. 2, four VCSEL arrays 320 are configured and arranged in the laser head 300 so that the four semiconductor chips C may be bonded at the same time. The control unit 800 increases the temperature of the semiconductor device by blinking or adjusting the output of each of the VCSEL devices 321 according to the pre-stored profile over time. The infrared laser light emitted from the VCSEL device 321 increases the temperature of the semiconductor device or penetrates the semiconductor chip C to increase the temperature of the solder bump on the lower surface of the semiconductor chip C. In this way, the control unit 800 controls the operation of the laser head 300 to melt the solder bump and bond the semiconductor chip C to the substrate S.

At this time, When the semiconductor chip C is bonded to the substrate S while the laser head 300 is in contact with the upper surface of the semiconductor chip C and the upper surface of the semiconductor chip C is pressed by the laser head 300, there is an advantage in that bonding is performed while preventing the bending of the semiconductor chip C due to an increase in the temperature of the semiconductor chip C. In order to perform contact bonding as described above, the laser head 300 may be configured to further include a pressure cover made of a transparent material covering each of the VCSEL arrays 320.

The VCSEL device 321 may quickly and accurately control blinking and output electronically. In particular, since the VCSEL device 321 emits high power energy, the control unit 800 may quickly and accurately bond the semiconductor chip C by controlling the operation of the laser head 300 in various ways. Since it is possible to quickly bond the semiconductor chip C as described above, the flip-chip bonding apparatus using VCSEL device of the present disclosure has an advantage of preventing damage to the semiconductor chip C or bending of the semiconductor chip C due to an unnecessary long-term increase in the temperature of the semiconductor chip C.

When bonding to the four semiconductor chips C is completed as described above, the head transfer unit 400 raises the laser head 300. The substrate transfer unit 200 transfers the substrate mounting unit 100 so that four new semiconductor chips C are disposed under the laser head 300. The head transfer unit 400 lowers the laser head 300 again, and the control unit 800 operates the laser head 300 to perform a bonding operation on the four new semiconductor chips C.

It is possible to perform the bonding operation of the semiconductor chip C with rapid and high quality by sequentially performing such a process.

In some cases, it is possible to operate the laser head 300 in a non-contact manner without driving the laser head 300 in a contact manner as described above. That is, it is possible to bond the semiconductor chip C by operating the laser head 300 while the laser head 300 is brought dose to a position not in contact with the semiconductor chip C by the head transfer unit 400. When bonding the semiconductor chip C as described above, the distance between the laser head 300 and the semiconductor chip C is preferably greater than 0 cm and less than 30 cm. That is, the distance between the laser head 300 and the semiconductor chip C is greater than 0 to prevent contact, but less than 30 cm to prevent excessive dispersion of the infrared laser light generated from the laser head 300. When the distance between the laser head 300 and the semiconductor chip C is narrow, it is easy to individually and accurately control the temperature of the semiconductor chip C at a location corresponding to each of the VCSEL devices 321. When the distance between the laser head 300 and the semiconductor chip C is gradually increased, the temperature of the semiconductor chip C may be relatively uniformly controlled.

Since the flip-chip bonding apparatus using VCSEL device of the present embodiment uses the VCSEL device 321 having a size within several mm, it is possible to control the temperature differently for each local region of the semiconductor chip C. For example, it is possible to operate the laser head 300 so that the infrared laser light is irradiated only around a location where the solder bump of the semiconductor chip C is disposed. Depending on the type of semiconductor chip C, there is also a semiconductor chip C in the form of a package in which a plurality of devices are combined. When bonding the semiconductor chip C of this kind, the control unit 800 may control the laser head 300 such that infrared lasers of different energy levels are irradiated for each location of the device according to the size, thickness and type of each device. At this time, in order for the control unit 800 to easily control individual temperature or control the output of the infrared laser light, the laser head 300 may be configured such that VCSEL arrays 320 having different characteristics are configured to correspond to the regions of individual elements, and that the VCSEL devices 321 belonging to the same VCSEL array 320 are of the same type.

In an embodiment, as described above that the VCSEL device 321 or the VCSEL arrays 320 are installed on the head body 310 so as to be attachable and detachable, it is also possible to configure and use the laser head 300 in a different combination each time depending on the type of the semiconductor chip C to be bonded. That is, the laser head 300 may be configured by combining different types of VCSEL devices 321 so as to irradiate infrared laser light having an appropriate temperature and intensity corresponding to the region of the semiconductor chip C. In this case, the laser head 300 is configured by combining VCSEL devices 321 having different frequency characteristics of the output infrared laser or different emission characteristics of the infrared laser light. By this method, the flip-chip bonding apparatus using VCSEL device of the present disclosure has the advantage of being able to perform a bonding operation using the laser head 300 configured to suit the characteristics of the semiconductor chip C to be bonded.

As described above, an embodiment of the present disclosure has been described with reference to FIGS. 1 to 3, but the scope of the present disclosure is not limited to the form described and illustrated above.

In an embodiment, the substrate transfer unit 200 having a structure that transfers the substrate mounting unit 100 in the horizontal direction has been described as an example, but a substrate transfer unit in the form of transferring the substrate S in the form of a conveyor belt may be used. In this case, it is possible to adjust the position of the laser head with respect to the substrate S by configuring the head transfer unit to be capable of not only raising and lowering but also horizontal transfer.

It is also possible to configure a flip-chip bonding apparatus using VCSEL device having only one of the substrate transfer unit and the head transfer unit.

In addition, the combination of the VCSEL device 321 and the VCSEL array constituting the laser head 300 may be configured using different VCSEL devices, or may be configured using VCSEL devices 321 of the same specification.

In addition, the VCSEL device 321 or the VCSEL array 320 has been described as being attachable and detachable to the head body 310, but in some cases, it is also possible to construct a laser head having a structure in which the VCSEL device and the VCSEL array are coupled and fixed to the head body. In some cases, the head body may be configured to be attachable and detachable.

Figure 4:
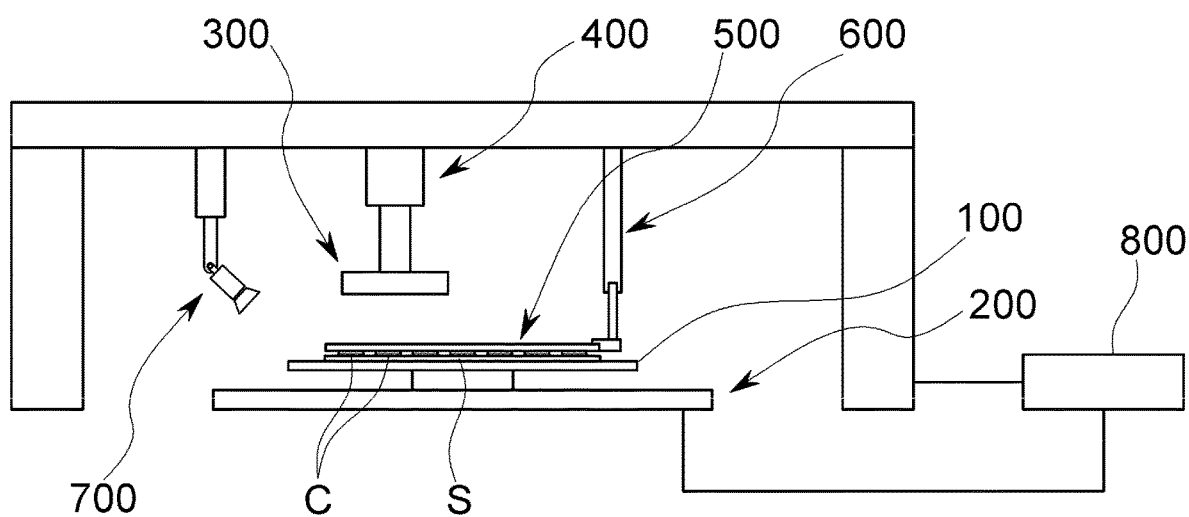
FIG. 4 is a front view of a flip-chip bonding apparatus using VCSEL device according to another embodiment of the present disclosure.

Next, referring to FIGS. 4 and 5, a flip-chip bonding apparatus using VCSEL device according to another embodiment of the present disclosure will be described. FIG. 4 is a front view of a flip-chip bonding apparatus using VCSEL device according to another embodiment of the present disclosure, and FIG. 5 is a plan view of a part of the flip-chip bonding apparatus using VCSEL device shown in FIG. 4.

Figure 5:
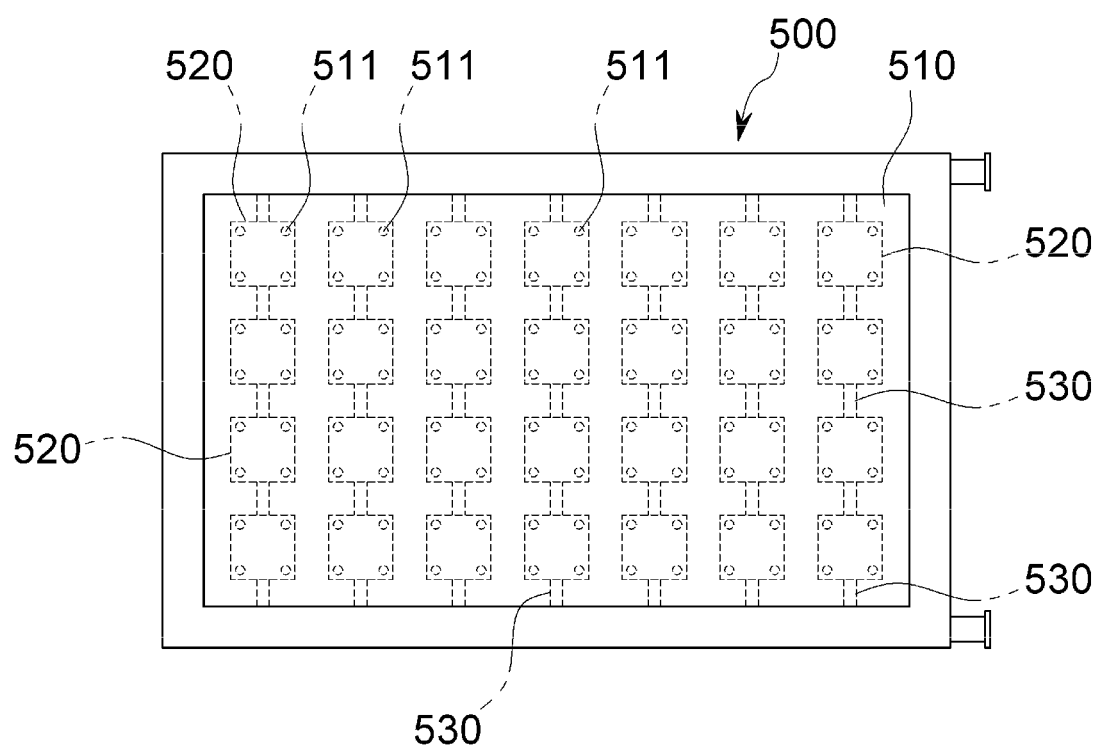
FIG. 5 is a plan view of a part of the flip-chip bonding apparatus using VCSEL device shown in FIG. 4.

Referring to FIGS. 4 and 5, compared to the flip-chip bonding apparatus using VCSEL device of the embodiment described with reference to FIGS. 1 to 3, the flip-chip bonding apparatus using VCSEL device according to the present embodiment is substantially the same, but has a difference in that it further includes a mask member 500, a mask transfer unit 600 and an infrared camera 700. Hereinafter, the same components as those of the embodiments of FIGS. 1 to 3 will be described with the same reference numerals.

The mask member 500 is disposed between the laser head 300 and the substrate mounting unit 100. The mask member 500 includes a transmissive portion 510 made of a transparent material. The transmissive portion 510 transmits the infrared laser light generated from the laser head 300 to the semiconductor chip C disposed below.

The mask transfer unit 600 serves to transfer the mask member 500.

In this embodiment, the mask member 500 further includes a suction hole 511 and a vacuum flow path 530. The suction hole 511 and the vacuum flow path 530 are formed in the transmissive portion 510 of the mask member 500. The suction hole 511 is formed at a position corresponding to the upper surface of the semiconductor chip C. In the case of this embodiment, as shown in FIG. 5, a cavity 520 that is an empty space inside the transmissive portion 510 is formed in each region of the transmissive portion 510 corresponding to each of the semiconductor chip C, and each of the cavities 520 has 4 suction holes 511. The vacuum flow path 530 is connected to the cavity 520. A vacuum pump is connected to the vacuum flow path 530. When air is sucked through the vacuum flow path 530 by operating the vacuum pump, negative pressure is transmitted through the suction hole 511 so that the upper surface of the semiconductor chip C is adsorbed to the lower surface of the transmissive portion 510. As described above, when the semiconductor chip C is adsorbed to the transmissive portion 510 by the suction hole 511, the semiconductor chip C is not bent and may maintain a flat state even while the semiconductor chip C is heated by the infrared laser light. With such a configuration, the quality of the bonding process of the flip-chip type semiconductor chip C to the substrate S may be improved.

As described above, the mask transfer unit 600 transfers the mask member 500. The control unit 800 operates the mask member 500. While the substrate S is transferred by the substrate transfer unit 200 or the position of the substrate S is aligned, the mask transfer unit 600 raises the mask member 500 so that it does not contact the semiconductor chip C. When the alignment of the substrate S is completed by the substrate transfer unit 200, the mask transfer unit 600 lowers the mask member 500 to contact the semiconductor chip C. In this state, the control unit 800 operates the vacuum pump so that the semiconductor chips C are adsorbed to the transmissive portion 510 of the mask member 500, and then operates the laser head 300 to sequentially bond the semiconductor chips C to substrate S.

Meanwhile, the infrared camera 700 measures the temperature of the semiconductor chip C by photographing the semiconductor chip C irradiated with the infrared laser light by the laser head 300. The control unit 800 may receive feedback of the temperature measured by the infrared camera 700 to control the operation of the laser head 300.

When the laser head 300 generates the infrared laser while there is a certain distance between the laser head 300 and the mask member 500, the infrared camera 700 may measure the temperature of the semiconductor chip C in real time.

In the case of generating the infrared laser in a state in which the laser head 300 is in contact with or very close to the mask member 500, the infrared camera 700 photographs the semiconductor chip C while the laser head 300 is raised after performing a work with the laser head 300.

In this embodiment, the transmissive portion 510 includes $BaF_2$. Unlike quartz, which transmits only visible light and infrared rays in a short wavelength region, $BaF_2$ is a transparent material that transmits infrared rays in a relatively long wavelength region. The quartz is a material that transmits light having a wavelength of 0.18 μm to 3.5 μm, while $BaF_2$ transmits light having a wavelength of 0.15 μm to 12 μm. When the solder bump of the semiconductor chip C is melted by irradiation with the infrared laser light, the temperature of the semiconductor chip C also rises. In general, the temperature of the semiconductor chip C varies between 50° C. and 500° C. According to the Wien's displacement law, the wavelength of infrared rays emitted from the semiconductor chip C, which varies between 50° C. and 500° C., is about 3 μm or more and 9 μm or less. As described above, since the transmissive portion 510 of the mask member 500 of the present embodiment is composed of the $BaF_2$, light having a wavelength of 0.15 μm to 12 μm is transmitted. That is, the transmissive portion 510 transmits not only all the laser light generated from the laser head 300, but also all infrared rays having a wavelength between 3 μm and 9 μm. For this reason, the infrared camera 700 may photograph the semiconductor chip C through the transmissive portion 510 while heating the semiconductor chip C disposed under the transmissive portion 510 by irradiating the infrared laser light. That is, the temperature of the semiconductor chip C that changes between 50° C. and 500° C. may be accurately measured by the infrared camera 700 through the transmissive portion 510. In fact, the temperature for heating the semiconductor chip C is often between 200° C. and 400° C., so that the temperature of the semiconductor chip C may be checked while heating the semiconductor chip C with the infrared laser by using the transmissive portion 510 capable of transmitting infrared rays in this temperature range while transmitting the laser light. In this case, the wavelength of the infrared ray corresponding to 200° C. to 400° C. corresponds to about 4 μm to 6 μm. As described above, the $BaF_2$ may be used as a material for the transmissive portion 510 because it transmits the infrared rays of the same wavelength band together with the infrared laser light. The material of the transmissive portion 510 is not limited to the $BrF_2$, and it is also possible to configure the transmissive portion 510 with another transparent material. As described above, in the process of irradiating the laser infrared laser light, the temperature of the semiconductor chip C changes between 5° C. and 500° C. In this case, the wavelength of the infrared rays irradiated from the semiconductor chip C is about 3 μm or more and about 9 μm or less. Accordingly, the transmissive portion 510 may be formed of various materials that transmit the infrared rays having a wavelength of 3 μm or more and 9 μm or less. For example, it is possible to configure the transmissive portion 510 with a material such as ZnSe. The ZnSe transmits infrared rays having a wavelength of 0.6 μm to 16 μm. It is also possible to form the transmissive portion 510 of a material such as Ge that transmits infrared rays having a wavelength of 2 μm to 16 μm. In addition, in some cases, the mask may be configured with a transmissive portion 510 that transmits infrared rays having a wavelength of 4 μm or more and 6.5 μm or less. Such a material may be a material such as CaF2 or MgF2.

In the above, although a preferred example has been described for the present disclosure, the scope of the present disclosure is not limited to the form described and illustrated above.

For example, although the flip-chip bonding apparatus using VCSEL device having the infrared camera 700 has been described as an example, it is also possible to configure a flip-chip bonding apparatus using VCSEL device that does not have the infrared camera.

The material of the transmissive portion of the mask member 500 is not limited to materials such as $BaF_2$, ZnSe, $CaF_2$, $MgF_2$, etc., it is possible to configure the transmissive portion with various other materials including the quartz.

In addition, although the suction hole 511 and the vacuum flow path 530 are formed for the mask member 500 as an example, it is also possible to construct a flip-chip bonding apparatus using VCSEL device by using a mask member not having such a configuration. In this case, it is possible to configure the flip-chip bonding apparatus using VCSEL device to pressurize the semiconductor chip C by using the mask transfer unit or by using the weight of the mask member itself.

In addition, although the flip-chip bonding apparatus using VCSEL device having the mask transfer unit 600 for transferring the mask member 500 has been described as an example, it is also possible to configure a flip-chip bonding apparatus using VCSEL device having a structure not provided with the mask transfer unit.

The flip-chip bonding apparatus using VCSEL device according to the present disclosure may quickly control laser light to bond a semiconductor chip to a substrate with high productivity and quality.

It should be understood that embodiments described herein should be considered in a descriptive sense only and not for purposes of limitation. Descriptions of features or aspects within each embodiment should typically be considered as available for other similar features or aspects in other embodiments.

What is claimed is:

1. A flip-chip bonding apparatus using a vertical cavity surface emitting laser (VCSEL) device comprising;
   a substrate mounting unit on which a substrate with a plurality of semiconductor chips disposed thereon, is mounted, wherein the plurality of semiconductor chips are disposed to be bonded to an upper surface of the substrate;
   a laser head having
      a plurality of VCSEL arrays and
      a head body on which the plurality of VCSEL arrays are installed, wherein the plurality of VCSEL arrays include a plurality of VCSEL devices emitting infrared laser so as to bond the semiconductor chips to the substrate by irradiating infrared laser light to the semiconductor chips on the substrate mounted on the substrate mounting unit;
   a head transfer unit configured to transfer the laser head; and
   a control unit configured to control an operation of the laser head and the head transfer unit.

2. The flip-chip bonding apparatus of claim 1, wherein at least some of the plurality of VCSEL arrays and at least some of the plurality of VCSEL devices of the laser head are each installed to be attachable to and detachable from the head body.

3. The flip-chip bonding apparatus of claim 1, wherein some of the plurality of VCSEL devices of the laser head are different from each other in terms of at least one of an output and a frequency of an emission laser.

4. The flip-chip bonding apparatus of claim 3, wherein the laser head is configured such that at least one of an output and a frequency of an emission laser of VCSEL devices in some regions of the plurality of VCSEL devices is different from that of VCSEL devices in other regions thereof.

5. The flip-chip bonding apparatus of claim 1, wherein the control unit controls the plurality of VCSEL arrays to be operated individually, and controls VCSEL devices belonging to the same VCSEL array among the VCSEL devices to be operated simultaneously.

6. The flip-chip bonding apparatus of claim 1, wherein the control unit controls the plurality of VCSEL devices to be individually operated.

7. The flip-chip bonding apparatus of claim 1, wherein in a state where the laser head is disposed, by the head transfer unit, to be in direct contact with one of the plurality of semiconductor chips, the control unit turns on the plurality of VCSEL devices to bond the semiconductor chips to the substrate.

8. The flip-chip bonding apparatus of claim 1, wherein in a state where the laser head is disposed, by the head transfer unit, at a height greater than 0 cm and less than 30 cm with respect to any one of the plurality of semiconductor chips, the control unit turns on the plurality of VCSEL devices to bond the semiconductor chips to the substrate.

9. The flip-chip bonding apparatus of claim 8, wherein the infrared laser light generated from the plurality of VCSEL devices is directly irradiated onto the semiconductor chip.

10. The flip-chip bonding apparatus of claim 1, wherein the control unit bonds any one of the semiconductor chips to the substrate by changing the output of the plurality of VCSEL devices of the laser head over time.

11. The flip-chip bonding apparatus of claim 10, further comprising
a substrate transfer unit configured to transfer the substrate mounting unit to the laser head, wherein the control unit is configured to control the operation of the substrate transfer unit.

12. The flip-chip bonding apparatus of claim 1, further comprising
a mask member having a transmissive portion through which infrared laser light transmits, wherein the mask member is disposed above the substrate mounting unit so as to contact an upper surface of the plurality of semiconductor chips disposed on the substrate.

13. The flip-chip bonding apparatus of claim 12, further comprising
a mask transfer unit configured to transfer the mask member.

14. The flip-chip bonding apparatus of claim 12, wherein the mask member further comprises
a suction hole formed on a lower surface of the transmissive portion to adsorb the semiconductor chips, and
a vacuum flow path formed in the transmissive portion and connected to the suction hole to transmit a negative pressure to the suction hole.

15. The flip-chip bonding apparatus of claim 12, further comprising an infrared camera photographing the semiconductor chips irradiated with the infrared laser light by the laser head,
wherein the transmissive portion of the mask member includes a material that transmits an infrared laser irradiated by the laser head and infrared rays having a wavelength of 3 µm or more and 9 µm or less.

16. The flip-chip bonding apparatus of claim 15, wherein the transmissive portion of the mask member includes a material that transmits infrared rays having a wavelength of 4 µm or more and 6.5 µm or less.

17. The flip-chip bonding apparatus of claim 15, wherein the transmissive portion of the mask member transmits the infrared laser irradiated by the laser head, and includes either $BaF_2$ or ZnSe.

18. The flip-chip bonding apparatus of claim 15,
wherein the infrared camera is configured to photograph the semiconductor chips when the infrared laser light is irradiated onto the semiconductor chips by the laser head, and
wherein the control unit is configured to control the operation of the plurality of VCSEL devices of the laser head by receiving feedback from values measured by the infrared camera.

* * * * *